United States Patent
Price et al.

(10) Patent No.: US 11,611,689 B1
(45) Date of Patent: Mar. 21, 2023

(54) THERMAL MITIGATION OF SINGLE PHOTON AVALANCHE DIODE ARRAYS IN HEAD-MOUNTED DISPLAYS

(71) Applicant: Microsoft Technology Licensing, LLC, Redmond, WA (US)

(72) Inventors: Raymond Kirk Price, Redmond, WA (US); Michael Bleyer, Seattle, WA (US); Christopher Douglas Edmonds, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/181,991

(22) Filed: Feb. 22, 2021

(51) Int. Cl.
  *H04N 5/225* (2006.01)
  *H05K 7/20* (2006.01)
  *G02B 27/01* (2006.01)
  *H01L 27/146* (2006.01)

(52) U.S. Cl.
  CPC ..... *H04N 5/22521* (2018.08); *G02B 27/0172* (2013.01); *H05K 7/20436* (2013.01); *G02B 2027/0138* (2013.01); *H01L 27/14643* (2013.01)

(58) Field of Classification Search
  CPC ............ H04N 5/22521; G02B 27/0172; G02B 2027/0138; H05K 7/20436; H01L 27/14643
  See application file for complete search history.

(56) References Cited

U.S. PATENT DOCUMENTS

| 10,701,249 B1* | 6/2020 | Guo ................... H05K 7/20409 |
| 10,888,037 B1 | 1/2021 | Toleno et al. | |
| 10,951,794 B2* | 3/2021 | Colin .................. H05K 7/20154 |
| 2018/0241917 A1* | 8/2018 | Zhang ..................... G03B 17/55 |
| 2018/0267390 A1* | 9/2018 | Kim et al. .......... H04M 1/0264 |
| 2019/0154949 A1* | 5/2019 | Hosoe .................. H04N 5/2257 |
| 2019/0339516 A1* | 11/2019 | Zhang ..................... G06F 1/203 |
| 2020/0204708 A1* | 6/2020 | Fujiwara .............. H04N 5/2252 |
| 2021/0105909 A1* | 4/2021 | Ide ...................... H04N 5/22521 |
| 2021/0318594 A1* | 10/2021 | Schmit ................. H04N 5/2252 |
| 2021/0399034 A1* | 12/2021 | Satou ....................... G02B 7/00 |

FOREIGN PATENT DOCUMENTS

| KR | 20200090016 A | 7/2020 |
| WO | 2012015965 A1 | 2/2012 |

OTHER PUBLICATIONS

"International Search Report and Written opinion Issued in PCT Application No. PCT/US22/011890", dated May 2, 2022, 11 Pages.

* cited by examiner

*Primary Examiner* — Ricardo Osorio
(74) *Attorney, Agent, or Firm* — Workman Nydegger (57) ABSTRACT

An image capture module configured for improved heat dissipation includes an image sensor, a first heat spreading element positioned to direct heat from the image sensor along a first heat dissipation path toward a first portion of the image capture module, a processing board in data communication with the image sensor, and a second heat spreading element positioned to dissipate heat from the processing board along a second heat dissipation path toward a second portion of the image capture module. Thermal isolation is used to isolate the different heat paths. The first heat dissipation path does not overlap the second heat dissipation path, the first portion of the image capture module is separate from the second portion of the image capture module.

17 Claims, 8 Drawing Sheets

THERMAL MITIGATION OF SINGLE PHOTON AVALANCHE DIODE ARRAYS IN HEAD-MOUNTED DISPLAYS

BACKGROUND

Mixed-reality (MR) systems, including virtual-reality and augmented-reality systems, have received significant attention because of their ability to create truly unique experiences for their users. For reference, conventional virtual-reality (VR) systems create a completely immersive experience by restricting their users' views to only a virtual environment. This is often achieved, in VR systems, through the use of a head-mounted device (HMD) that completely blocks any view of the real world. As a result, a user is entirely immersed within the virtual environment. In contrast, conventional augmented-reality (AR) systems create an augmented-reality experience by visually presenting virtual objects that are placed in or that interact with the real world.

As used herein, VR and AR systems are described and referenced interchangeably. Unless stated otherwise, the descriptions herein apply equally to all types of mixed-reality systems, which (as detailed above) includes AR systems, VR reality systems, and/or any other similar system capable of displaying virtual objects.

Many MR systems include one or more image sensors (e.g., cameras) that can be used for a variety of purposes. For example, an MR system may utilize images and/or depth information obtained using the camera(s) to provide pass-through views of a user's environment to the user. Other functions often performed by MR systems that utilize images captured using image sensors include object tracking (e.g., hand tracking), surface reconstruction, semantic labeling, 3D reconstruction of objects, and/or others.

Various types of image sensors are used in MR systems to facilitate the foregoing and/or other functions. Image sensors that utilize single photon avalanche diodes (SPADs) can facilitate various advantages over conventional complementary metal-oxide-semiconductor (CMOS) and/or charge-coupled device (CCD) sensors.

A SPAD is operated at a bias voltage that enables the SPAD to detect a single photon. Upon detecting a single photon, an electron-hole pair is formed, and the electron is accelerated across a high electric field, causing avalanche multiplication (e.g., generating additional electron-hole pairs). Thus, each detected photon may trigger an avalanche event. A SPAD may operate in a gated manner (each gate corresponding to a separate shutter operation), where each gated shutter operation may be configured to result in a binary output. The binary output may comprise a "1" where an avalanche event was detected during an exposure (e.g., where a photon was detected), or a "0" where no avalanche event was detected.

Separate shutter operations may be integrated over a frame capture time period. The binary output of the shutter operations over a frame capture time period may be counted, and an intensity value may be calculated based on the counted binary output.

An array of SPADs may form an image sensor, with each SPAD forming a separate pixel in the SPAD array. To capture an image of an environment, each SPAD pixel may detect avalanche events and provide binary output for consecutive shutter operations in the manner described herein. The per-pixel binary output of multiple shutter operations over a frame capture time period may be counted, and per-pixel intensity values may be calculated based on the counted per-pixel binary output. The per-pixel intensity values may be used to form an intensity image of an environment.

Because of the binarization of SPAD output, SPAD sensors can avoid read noise and therefore facilitate high-framerate imaging under low light conditions and/or in a manner that mitigates motion blur. Aside from image capture, the binarization of SPAD output enables SPAD sensors to perform other operations. For instance, SPAD sensors are usable for performing time-of-flight depth operations, such as by emitting successive pulses of light and performing respective shutter operations for each light pulse using different delay periods (e.g., time delays between the emission of a pulse and the performance of a shutter operation). The different delay periods may correspond to different distances or ranges of distances that the pulsed light may have traveled before being detected by a SPAD pixel. A system may thus track the time-delayed shutter operations that result in a detected photon on a per-pixel basis, thereby obtaining per-pixel depth information.

However, SPAD sensors are sensitive to noise associated with dark count rate or leakage current. Noise from dark count rate present in SPAD sensor signals increases with temperature and can, in some instances, double with every 6-7° C. increase in temperature. Thus, maintaining a cool sensor temperature is desirable when implementing SPAD sensors for image capture and/or time-of-flight operations.

However, many problems arise when attempting to maintain a cool SPAD sensor temperature on an HMD (or another compact or wearable/moveable device). For example, thermal mitigation approaches that require a large amount of space and/or weight can degrade user experiences with HMDs by adding to device bulk and/or heft. Although many HMDs include thermal management components, increasing power consumption by such components to further reduce overall HMD temperature results in reduced battery life and may fail to provide sufficiently targeted thermal mitigation to the SPAD sensor(s).

Furthermore, HMDs are used in diverse circumstances and locations and are used by diverse types of users. For example, HMDs may be used in hot, humid environments (e.g., tropical environments) which may result in a high SPAD sensor temperature and therefore increased dark count rate in SPAD sensor signals. In addition, HMDs include other heat-generating components aside from SPAD sensors, such as displays, laser diodes, processors (e.g., central processing units (CPUs), graphics processing units (GPUs), holographic processing units (HPUs), etc.), other image sensors (e.g., thermal cameras), application-specific integrated circuits (ASICs), and/or others. These other heat-generating components can result in cross-heating of SPAD sensors and can therefore degrade SPAD performance.

Thus, for at least the foregoing reasons, there is an ongoing need and desire for improved thermal mitigation of SPAD arrays in HMDs.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments are directed to systems, methods, and devices for thermal mitigation of single-photon avalanche diode (SPAD) arrays in head-mounted displays (HMDs).

Some embodiments provide an image capture module configured for improved heat dissipation. The image capture module includes an image sensor, a first heat spreading element positioned to direct heat from the image sensor along a first heat dissipation path toward a first portion of the image capture module, a processing board in data communication with the image sensor, and a second heat spreading element positioned to dissipate heat from the processing board along a second heat dissipation path toward a second portion of the image capture module. The first heat dissipation path does not overlap the second heat dissipation path, the first portion of the image capture module is separate from the second portion of the image capture module.

In some embodiments, the image capture module is mounted on an HMD, heat from the image sensor is dissipated to a first portion of the HMD, and heat from the processing board is dissipated to a second portion of the HMD. The second portion of the HMD may include a thermal bus configured to dissipate heat from other components of the HMD in addition to the processing board of the image capture module.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Disclosed embodiments are generally directed to systems, methods and devices for thermal mitigation of single photon avalanche diode (SPAD) arrays, particularly in head-mounted displays (HMDs).

Examples of Technical Benefits, Improvements, and Practical Applications

Those skilled in the art will recognize, in view of the present disclosure, that at least some of the disclosed embodiments may be implemented to address various shortcomings associated with at least some conventional techniques for thermal mitigation of SPAD sensors, particularly on HMDs. The following section outlines some example improvements and/or practical applications provided by the disclosed embodiments. It will be appreciated, however, that the following are examples only and that the embodiments described herein are in no way limited to the example improvements discussed herein.

Embodiments of the present disclosure may allow for implementation of SPAD arrays into HMDs in a manner that facilitates a reduced operating temperature of the SPAD arrays (e.g., as compared to conventional approaches for implementing SPAD arrays into HMDs). Providing SPAD sensors on HMDs that operate at a reduced temperature may reduce the prevalence of dark count rate (DCR) (or simply count rate) in image signals detected using the SPAD sensors, which may in turn reduce the noise present in images generated based on the image signals. A reduction in noise brought about by dark count rate may also improve any other operations that rely on the image signals.

By thermally isolating SPAD arrays from other heat-generating components of an image capture module and/or of an HMD (or other device), implementations of the present disclosure may facilitate a lower operating temperature of SPADs in a compact, targeted manner, and without requiring significant increases in power consumption.

Having just described some of the various high-level features and benefits of the disclosed embodiments, attention will now be directed to FIGS. 1 through 6. These Figures illustrate various conceptual representations, architectures, methods, and supporting illustrations related to the disclosed embodiments.

Example Systems and Techniques for Thermal Mitigation of SPAD Arrays

Figure 1:
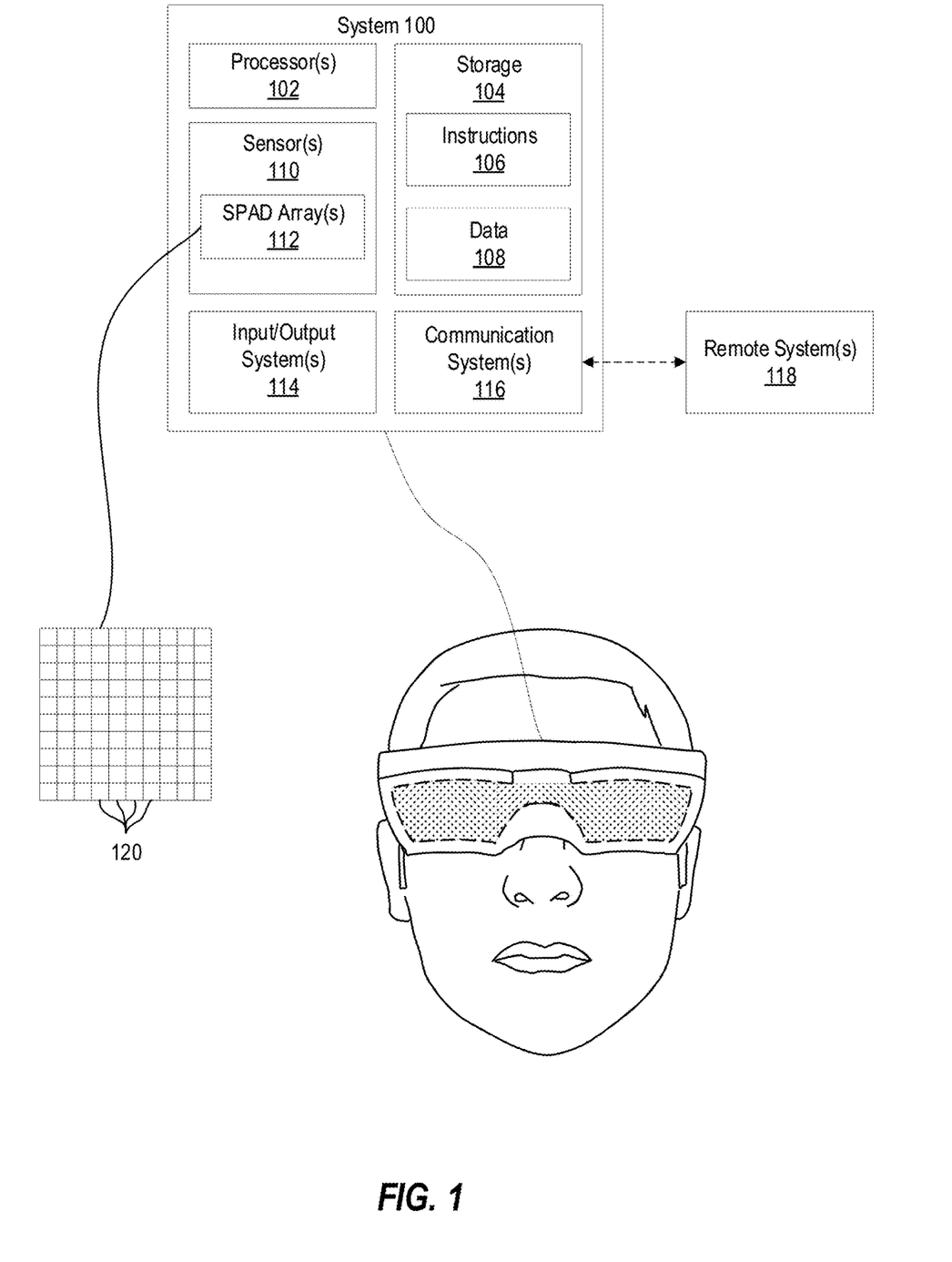
FIG. 1 illustrates example components of an example system that may include or be used to implement one or more disclosed embodiments.

Attention is now directed to FIG. 1, which illustrates an example system 100 that may include or be used to implement one or more disclosed embodiments. FIG. 1 depicts the system 100 as a head-mounted display (HMD) configured for placement over a head of a user to display virtual content for viewing by the user's eyes. Such an HMD may comprise an augmented reality (AR) system, a virtual reality (VR) system, and/or any other type of HMD. Although the present disclosure focuses, in at least some respects, on a system 100 implemented as an HMD, it should be noted that at the techniques described herein for thermal mitigation of SPAD arrays may be implemented using other types of systems.

FIG. 1 illustrates various example components of the system 100. For example, FIG. 1 illustrates an implementation in which the system includes processor(s) 102, storage 104, sensor(s) 110, I/O system(s) 114, and communication system(s) 116. Although FIG. 1 illustrates a system 100 as including particular components, one will appreciate, in view of the present disclosure, that a system 100 may comprise any number of additional or alternative components.

The processor(s) 102 may comprise one or more sets of electronic circuitry that include any number of logic units, registers, and/or control units to facilitate the execution of computer-readable instructions (e.g., instructions that form a computer program). Such computer-readable instructions may be stored within storage 104. The storage 104 may comprise physical system memory and may be volatile, non-volatile, or some combination thereof. Furthermore, storage 104 may comprise local storage, remote storage (e.g., accessible via communication system(s) 116 or otherwise), or some combination thereof. Additional details related to processors (e.g., processor(s) 102) and computer storage media (e.g., storage 104) will be provided hereinafter.

In some implementations, the processor(s) 102 may comprise or be configurable to execute any combination of software and/or hardware components that are operable to facilitate processing using machine learning models or other artificial intelligence-based structures/architectures. For example, processor(s) 102 may comprise and/or utilize hardware components or computer-executable instructions operable to carry out function blocks and/or processing layers configured in the form of, by way of non-limiting example, single-layer neural networks, feed forward neural networks, radial basis function networks, deep feed-forward networks, recurrent neural networks, long-short term memory (LSTM) networks, gated recurrent units, autoencoder neural networks, variational autoencoders, denoising autoencoders, sparse autoencoders, Markov chains, Hopfield neural networks, Boltzmann machine networks, restricted Boltzmann machine networks, deep belief networks, deep convolutional networks (or convolutional neural networks), deconvolutional neural networks, deep convolutional inverse graphics networks, generative adversarial networks, liquid state machines, extreme learning machines, echo state networks, deep residual networks, Kohonen networks, support vector machines, neural Turing machines, and/or others.

As will be described in more detail, the processor(s) 102 may be configured to execute instructions 106 stored within storage 104 to perform certain actions associated with thermal mitigation of SPAD arrays. The actions may rely at least in part on data 108 stored on storage 104 in a volatile or non-volatile manner.

In some instances, the actions may rely at least in part on communication system(s) 116 for receiving data from remote system(s) 118, which may include, for example, separate systems or computing devices, sensors, and/or others. The communications system(s) 118 may comprise any combination of software or hardware components that are operable to facilitate communication between on-system components/devices and/or with off-system components/devices. For example, the communications system(s) 118 may comprise ports, buses, or other physical connection apparatuses for communicating with other devices/components. Additionally, or alternatively, the communications system(s) 118 may comprise systems/components operable to communicate wirelessly with external systems and/or devices through any suitable communication channel(s), such as, by way of non-limiting example, Bluetooth, ultra-wideband, WLAN, infrared communication, and/or others.

FIG. 1 illustrates that a system 100 may comprise or be in communication with sensor(s) 110. Sensor(s) 110 may comprise any device for capturing or measuring data representative of perceivable phenomenon. By way of non-limiting example, the sensor(s) 110 may comprise one or more image sensors, microphones, thermometers, barometers, magnetometers, accelerometers, gyroscopes, and/or others.

FIG. 1 also illustrates that the sensor(s) 110 may include SPAD array(s) 112. As depicted in FIG. 1, a SPAD array 112 may comprise an arrangement of SPAD pixels 120 that are each configured to facilitate avalanche events in response to sensing a photon, as described hereinabove. SPAD array(s) 112 may be implemented on a system 100 (e.g., an MR HMD) to facilitate various functions such as image capture and/or computer vision tasks.

Furthermore, FIG. 1 illustrates that a system 100 may comprise or be in communication with I/O system(s) 114. I/O system(s) 114 may include any type of input or output device such as, by way of non-limiting example, a touch screen, a mouse, a keyboard, a controller, and/or others, without limitation. For example, the I/O system(s) 114 may include a display system that may comprise any number of display panels, optics, laser scanning display assemblies, and/or other components. In some instances, a SPAD array 112 may be configured with a resolution of SPAD pixels 120 that matches a pixel resolution of a display system, which may facilitate high-fidelity pass-through imaging.

Figure 2:
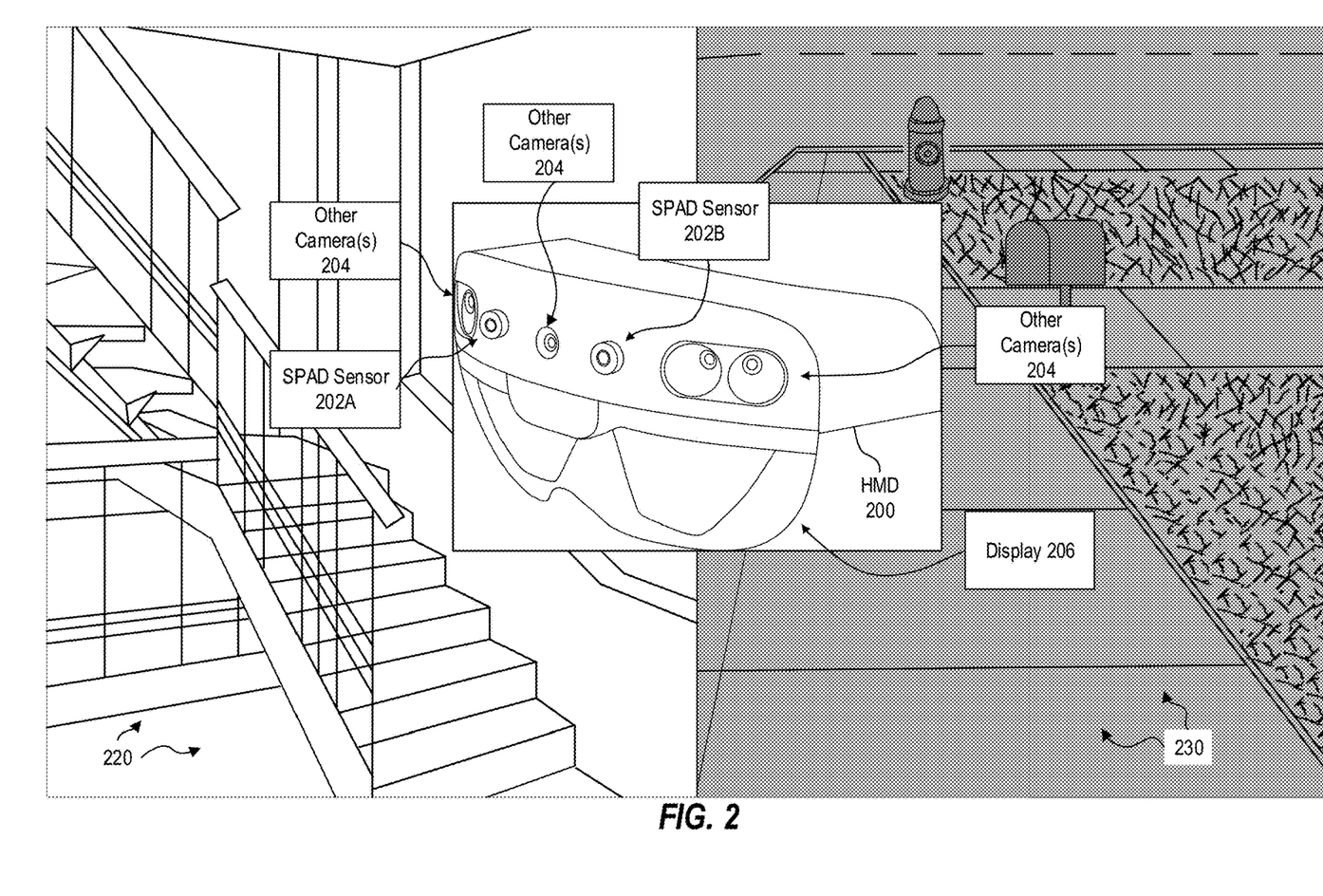
FIG. 2 illustrates example implementations of single photon avalanche diode (SPAD) sensors in head-mounted displays (HMD) configured for facilitating one or more disclosed embodiments in different physical environments.

FIG. 2 illustrates example implementations of single photon avalanche diode (SPAD) sensors that may be implemented in a head-mounted display (HMD) configured for facilitating one or more disclosed embodiments in different physical environments. In particular, FIG. 2 shows an example HMD 200, which may correspond in at least some respects to the system 100 described hereinabove with reference to FIG. 1. As shown in FIG. 2, the HMD 200 includes SPAD sensors 202A and 202B, which together may comprise a stereo pair of SPAD sensors. The SPAD sensors 202A and 202B may be configured to capture intensity image frames as described hereinabove (e.g., by counting photons or avalanche events detected over a frame capture time period on a per-pixel basis). Intensity images captured using the SPAD sensors 202A and 202B may be used for a variety of purposes, such as to facilitate image/video capture, pass-through imaging, depth computations, object tracking, object segmentation, surface reconstruction, simultaneous localization and mapping (SLAM), and/or others. Although FIG. 2 illustrates a stereo pair of SPAD sensors 202A and 202B, an HMD 200 may implement any number of additional or alternative SPAD sensors for additional or alternative purposes (e.g., a SPAD sensor coupled with an active illuminator, providing a gated time-of-flight sensor).

The SPAD sensors 202A and 202B of an HMD 200 may be configured to capture real-world environments under various lighting conditions. For example, FIG. 2 illustrates a lighted environment 220 and a low light environment 230. A lighted environment 220 may have ambient lighting of about 10 lux or above, whereas a low light environment 230 may have ambient lighting of about 10 lux or below.

As noted above, SPADs are susceptible to noise resulting from dark count rate, which is exacerbated with higher operating temperatures. This noise affects image quality and can be particularly detrimental for images of low light environments 230 captured using SPAD. For example, when imaging in a low light environment 230, SPADs of may detect a low number of photons (e.g., 10 or fewer in some instances). With a low number of photons forming the signal detected by a SPAD, the effects of noise in the signal (caused by dark count rate) can become more prevalent or dominant.

Furthermore, as noted above, an HMD 200 often includes other components that cause cross-heating that increases the operating temperature of a SPAD sensor, which can therefore increase the dark count rate (and therefore the noise) of the SPAD sensor. For example, FIG. 2 shows that the HMD 200 may comprise a display 206 positioned on the HMD 200 to display images for viewing by one or more eyes of a user operating the HMD 200. In some instances, the display 206 comprises at least a portion of an optically transparent display assembly configured to display images to a user while allowing environmental light (if any) to transmit toward the user's eye(s). In some instances, the display 206 comprises at least a portion of an optically opaque display assembly that is configured to display images to a user while substantially preventing environmental light (if any) from transmitting toward or reaching the user's eye(s). A display 206 may include various components that can cause heating of the SPAD sensors 202A and 202B, such as laser diodes, microelectromechanical systems (e.g., MEMS mirrors), etc.

Additionally, as illustrated in FIG. 2, an HMD 200 may include other cameras 204, such as RGB cameras, infrared cameras (e.g., thermal cameras), ultraviolet cameras, and/or other image sensing components implemented for various purposes. Other cameras 204 can also cause heating of the SPAD sensors 202A and 202B, thereby increasing dark count rate of the SPAD sensors 202A and 202B.

An HMD 200 (or other system) may additionally or alternatively include any number of other components not explicitly shown in FIG. 2 that can increase the operating temperature of SPAD sensors present on the HMD 200 (or other system), such as processing units (e.g., processor(s) 102, CPUs, GPUs, HPUs), application-specific integrated circuits (ASICs), and/or others.

Figure 3A:
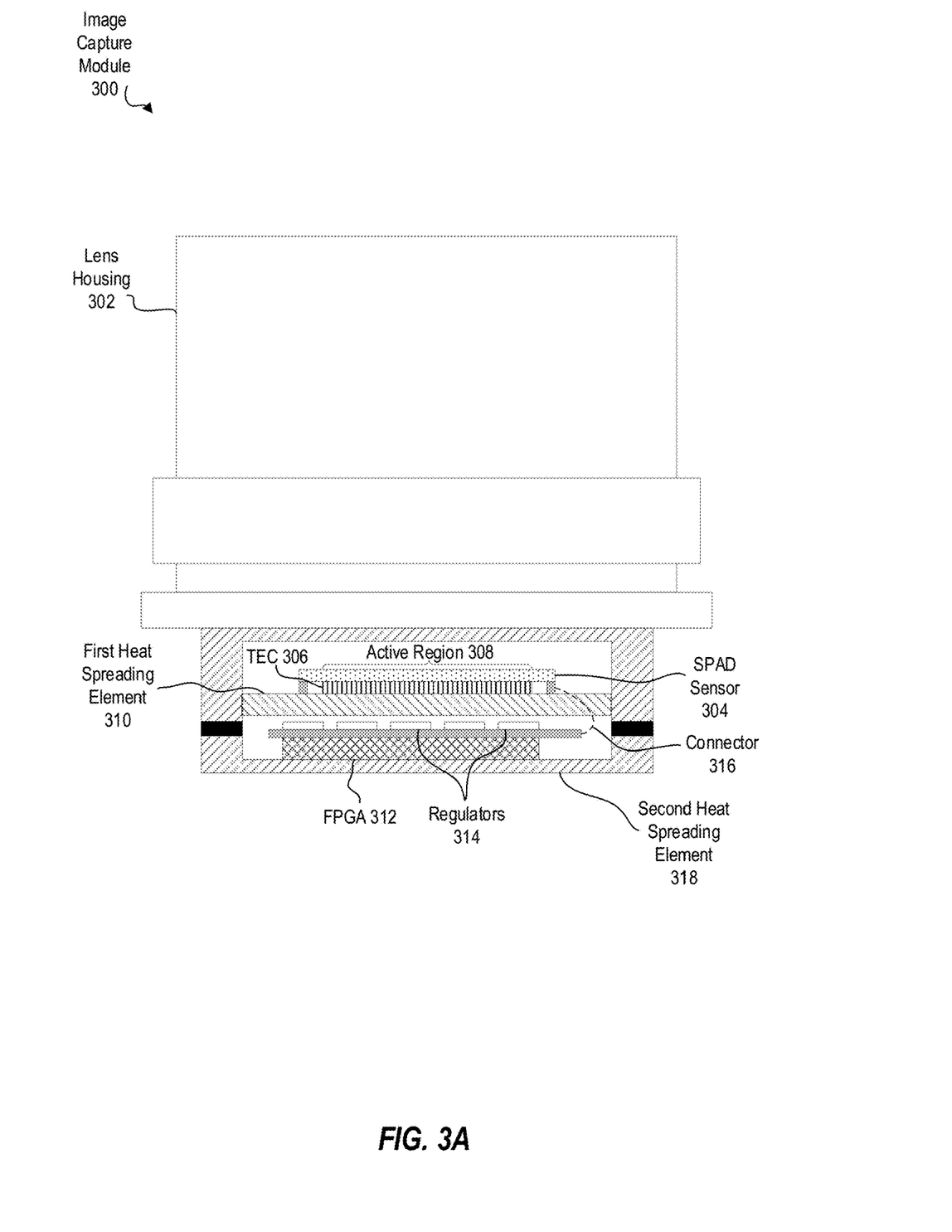
FIGS. 3A-3C illustrate an example image capture module and example heat dissipation characteristics thereof.
Figure 3B:
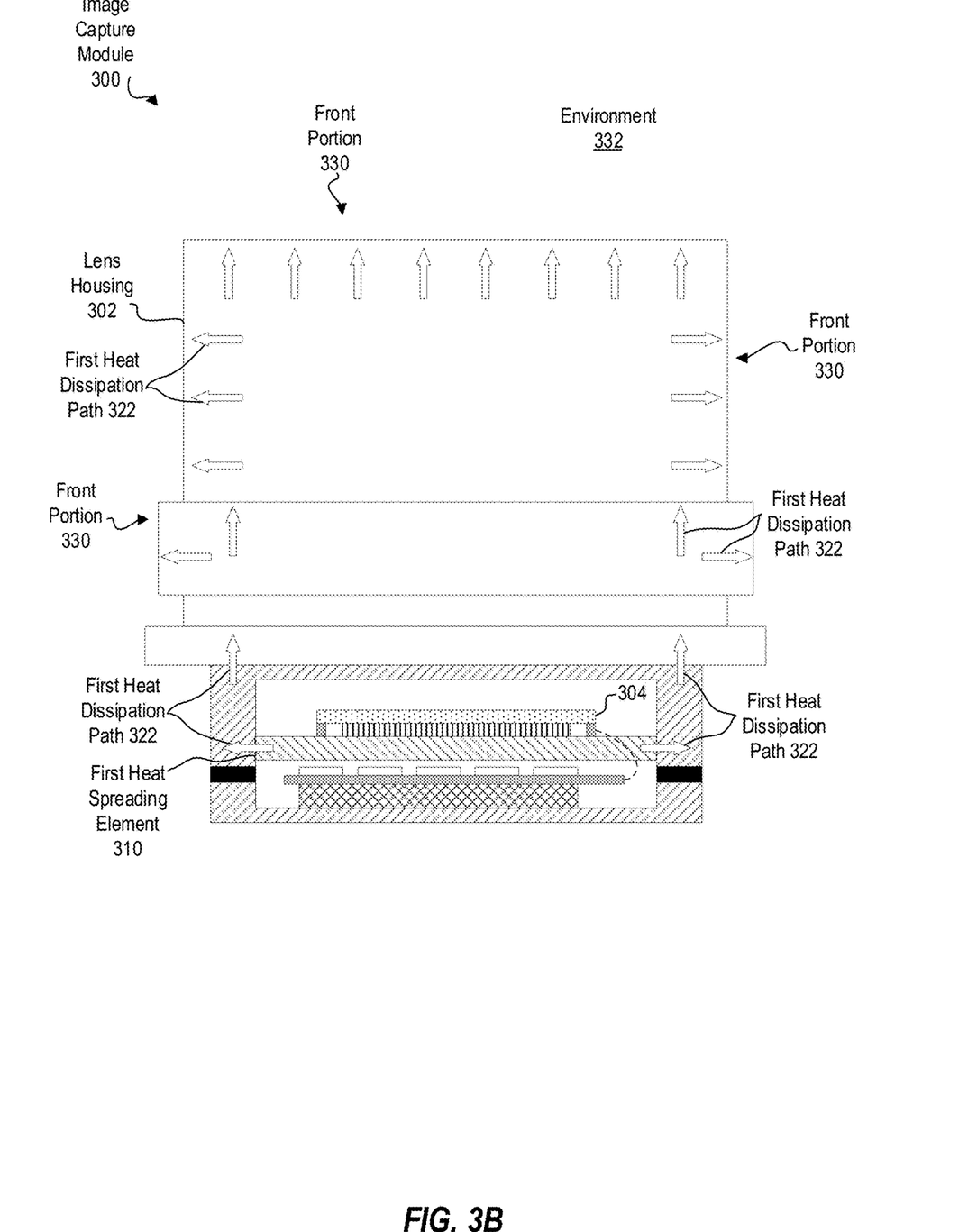
Figure 3C:
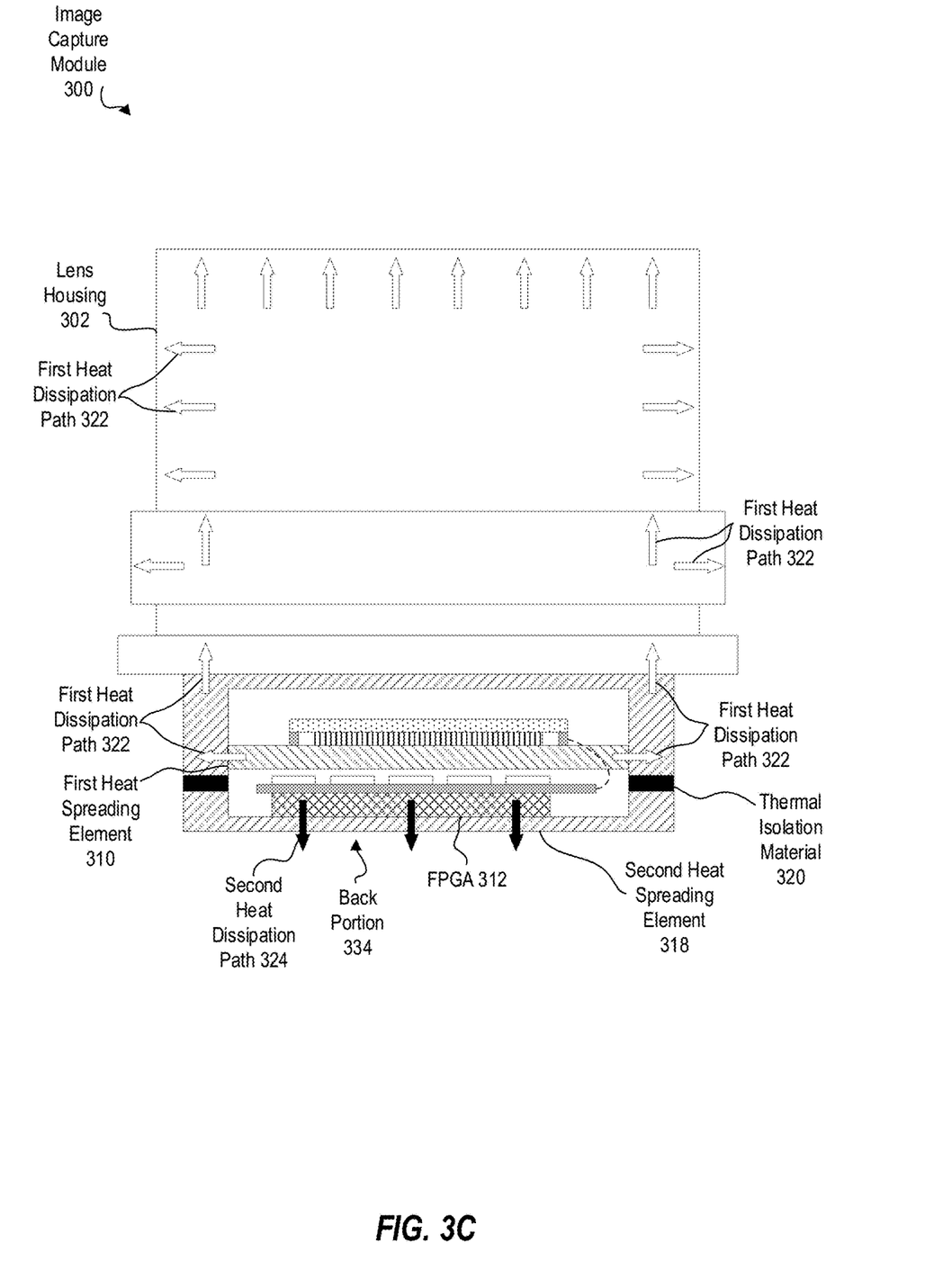

FIGS. 3A-3C illustrate an example image capture module 300 and example heat dissipation characteristics thereof. An image capture module 300, as described herein, can facilitate thermal mitigation of image sensing components thereof (e.g., a SPAD array) by dissipating heat from the image sensing components and/or by thermally isolating the image sensing components from other components that can cause cross-heating of the image sensing components.

FIG. 3A illustrates a conceptual representation of the image capture module 300 in partial cross-section to emphasize certain components of the image capture module 300. For instance, although the lens housing 302 of the image capture module 300 houses a lens assembly configured to direct light toward the image sensor of the image capture module 300, FIG. 3A omits details of the lens assembly for simplicity.

FIG. 3A shows the image sensor of the image capture module 300 implemented as a SPAD sensor 304 that includes an array of SPAD sensor pixels as described hereinabove. Notwithstanding FIG. 3A depicting a SPAD sensor 304, techniques of the present disclosure may be used to facilitate thermal mitigation of other types of image sensors (e.g., other types of silicon sensors).

FIG. 3A furthermore illustrates a first heat spreading element 310 positioned on the image capture module 300 near or proximate to the SPAD sensor 304. The first heat spreading element 310 is configured in thermal communication with the SPAD sensor in order to allow the first heat spreading element 310 to direct heat generated by the SPAD sensor 304 away from the SPAD sensor 304. Such functionality may facilitate a lower operating temperature of the SPAD sensor 304 and may therefore reduce noise resulting from dark count rate. The first heat spreading element 310 (or any heat spreading element described herein) may comprise any suitable material with a sufficiently high thermal conductivity, such as copper, aluminum, diamond, molybdenum, and/or others.

FIG. 3A illustrates an implementation in which heat generated by the SPAD sensor 304 is directed to the first heat spreading element 310 via a thermoelectric cooler 306 (TEC 306). The TEC 306 is illustrated in FIG. 3A as abutting an active region 308 (or photon detecting region) of the SPAD sensor 304 so as to transfer heat from the active region 308 of the SPAD sensor 304 to the first heat spreading element 310. Use of a TEC 306 to transfer heat from the active region 308 of the SPAD sensor 304 may advantageously allow the SPAD sensor 304 to operate below the ambient temperature surrounding the SPAD sensor 304.

In some instances, the TEC 306 is selectively activated (e.g., via execution of instructions 106 of a system 100) in response to detecting that a temperature of the SPAD sensor 304 (or a temperature of the active region 308) satisfies a threshold temperature (e.g., above 30° C. or another temperature value). For example, the TEC 306 may remain inactive unless a temperature sensor sensing a temperature associated with the SPAD sensor 304 indicates that the temperature associated with the SPAD sensor 304 meets or exceeds the threshold temperature, which may trigger activation of the TEC 306 to cool the SPAD sensor 304. In other instances, the TEC 306 remains active while the SPAD sensor 304 is active.

Figure 4:
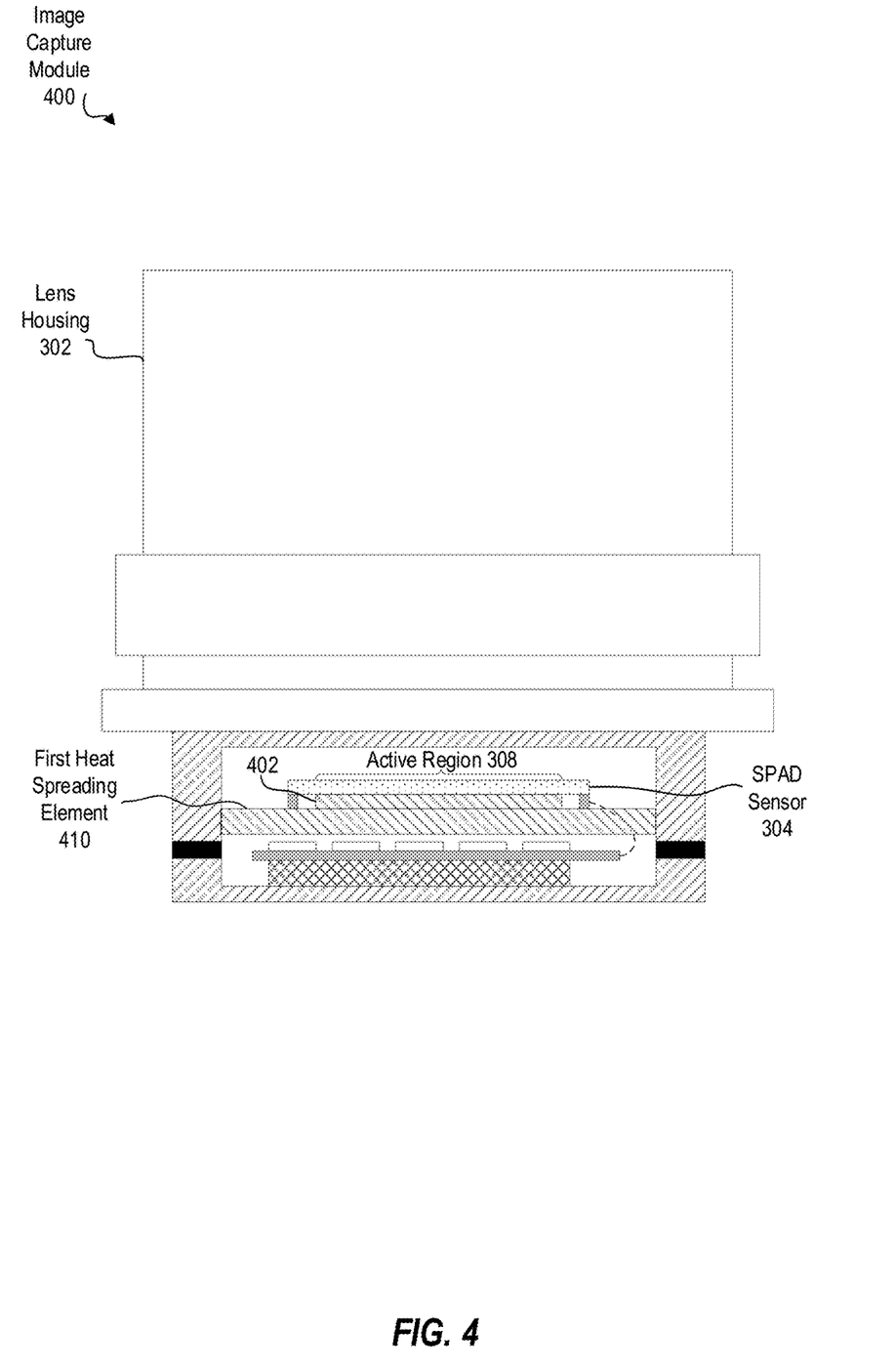
FIG. 4 illustrates an additional embodiment of an image capture module, in accordance with the present disclosure.

Other types of heat spreading devices, such as heat pipes, vapor chambers, etc., may be used in addition or as alternatives to a TEC 306. Furthermore, in some instances, an image capture module 300 omits a TEC 306 or other type of heat spreading device, placing the first heat spreading element 310 in direct contact with the active region 308 of the SPAD sensor 304. For instance, FIG. 4 illustrates an example implementation of an image capture module 400 that omits a TEC and in which the first heat spreading element 410 includes a portion 402 that extends into contact with the active region 308 of the SPAD sensor 304. In some instances, omitting a TEC 306 reduces power consumption associated with thermal mitigation of the SPAD sensor 304.

Returning again to FIG. 3A, the image capture module 300 includes a processing board that is in data communication with the SPAD sensor 304 via connector 316. The processing board includes logic units, control units, and/or other components (e.g., regulators 314) that is/are configured, in some instances, to facilitate photon counting based on photons detected at the SPAD sensor (e.g., to form images). The processing board of FIG. 3A is illustrates as a field programmable gate array 312 (FPGA 312), but other types of processing circuitries (e.g., microprocessors) are within the scope of this disclosure.

During operation, the FPGA 312 generates heat that can cause cross-heating of the SPAD sensor 304 (thereby increasing dark count rate of the SPAD sensor 304). Accordingly, FIG. 3A illustrates the FPGA 312 as being positioned on the image capture module 300 spatially offset from the SPAD sensor 304, thereby providing thermal isolation between the SPAD sensor 304 and the FPGA 312. Furthermore, FIG. 3A shows the FPGA 312 in thermal communication with a second heat spreading element 318 that is separate from the first heat spreading element 310 that receives heat from the SPAD sensor 304. The second heat spreading element 318 is configured to direct heat generated by the FPGA 312 away from FPGA 312. By utilizing separate heat spreading elements 310 and 318 for the SPAD sensor 304 and the FPGA 312, respectively, the image capture module advantageously avoids transferring the heat from the FPGA 312 toward the SPAD sensor 304.

To further prevent cross-heating between the SPAD sensor 304 from the FPGA 312, the first heat spreading element 310 and the second heat spreading 318 are configured to dissipate heat along different heat dissipation paths. FIG. 3B illustrates a first heat dissipation path 322 indicating the flow of heat dissipated from the SPAD sensor 304 through the image capture module 300. The first heat dissipation path 322 is depicted in FIG. 3B with white arrows. The first heat dissipation path 322 may at least partially encompass at least a portion of the first heat spreading element 310 and/or other components of the image capture module 300, such as at least a portion of the lens housing 302 and/or other structural elements of the image capture module 300.

As with the first heat spreading element 310, the first heat dissipation path (as well as other heat dissipation paths described herein) may be formed from any material with a suitably high thermal conductivity.

FIG. 3B shows that the first heat dissipation path 322 directs the heat transferred from the SPAD sensor 304 via the first heat spreading element 310 toward a first portion of the image capture module 300. In the example implementation illustrated in FIG. 3B, the first portion of the image capture module 300 that receives the heat transferred from the SPAD sensor 304 is the front portion 330 of the image capture module 300. In some instances, the front portion 330 of the image capture module 300 is at least partially exposed to an environment 332 (e.g., air, water, empty space, etc.), thereby allowing the heat transferred to the front portion 330 of the image capture module 300 to dissipate into the environment 332 surrounding the image capture module 300. Such functionality can facilitate a cool operating temperature of the SPAD sensor 304.

Although FIG. 3B focuses on an example in which heat from the SPAD sensor 304 is transferred to a front portion 330 of the image capture module 300, a first heat dissipation path 322 may transfer heat from the SPAD sensor 304 to other portions of the image capture module 300 or another device, in accordance with the present disclosure.

FIG. 3C illustrates a second heat dissipation path 324 indicating the flow of heat dissipated from the FPGA 312 through the image capture module 300. The second heat dissipation path 324 is depicted in FIG. 3C with black arrows. The second heat dissipation path 324 may at least partially encompass at least a portion of the second heat spreading element 318 and/or other components of the image capture module 300.

FIG. 3C shows that the second heat dissipation path 324 directs the heat transferred from the FPGA 312 via the second heat spreading element 318 toward a second portion of the image capture module 300 (e.g., toward an image computation or image processing engine). In the example implementation illustrated in FIG. 3C, the second portion of the image capture module 300 that receives the heat transferred from the FPGA 312 is the back portion 334 of the image capture module 300. Similar to the front portion 330 of the image capture module 300 discussed above, the back portion 334 of the image capture module 300 may, in some instances, lead the heat from the FPGA 312 to an environment or other devices/components that are separate or distinct from the image capture module 300 (e.g., a thermal bus of an HMD, as described in examples hereinafter).

Although FIG. 3C focuses on an example in which heat from the FPGA 312 is transferred to a back portion 334 of the image capture module 300, a second heat dissipation path 324 may transfer heat from the FPGA 312 to other portions of the image capture module 300 or another device, in accordance with the present disclosure.

As is evident from FIG. 3C, the second heat dissipation path 324 is separate from and does not overlap with the first heat dissipation path 322. For example, FIG. 3C illustrates a thermal isolation material 320 separating the first heat dissipation path 322 from the second heat dissipation path 324 (also separating the first heat spreading element 310 from the second heat spreading element 318). The thermal isolation material 320 of the example shown in FIG. 3C thermally isolates the first heat dissipation path 322 from the second heat dissipation path 324 to help prevent heat transferred from the FPGA 312 from cross-heating the SPAD sensor 304.

A thermal isolation material 320 may be formed from any material with a suitably low thermal conductivity, such as, by way of non-limiting example, a plastic, resin, glass, and/or other material. In some implementations, rather than a thermal isolation material 320, a thermal isolation gap intervenes between the first heat dissipation path 322 and the second heat dissipation path 324. For instance, the image capture module 300 may comprise two separate parts, with one part including the SPAD sensor 304 and the other part including the FPGA 312. The two parts may be separately mounted to an HMD in a manner that prevents the first heat dissipation path 322 from contacting the second heat dissipation path 324, thereby providing a thermal isolation gap between the first heat dissipation path 322 and the second heat dissipation path 324.

The image capture module 300 of FIGS. 3A-3C illustrates that an image sensor (e.g., SPAD sensor 304) may be thermally isolated from a processing board (e.g., FPGA 312) within the same image capture module 300, thereby advantageously preventing cross-heating from the processing board to the image sensor. The principles and/or techniques discussed with reference to FIGS. 3A-3C may be applied to implement a thermally mitigated SPAD sensor on an HMD.

Figure 5:
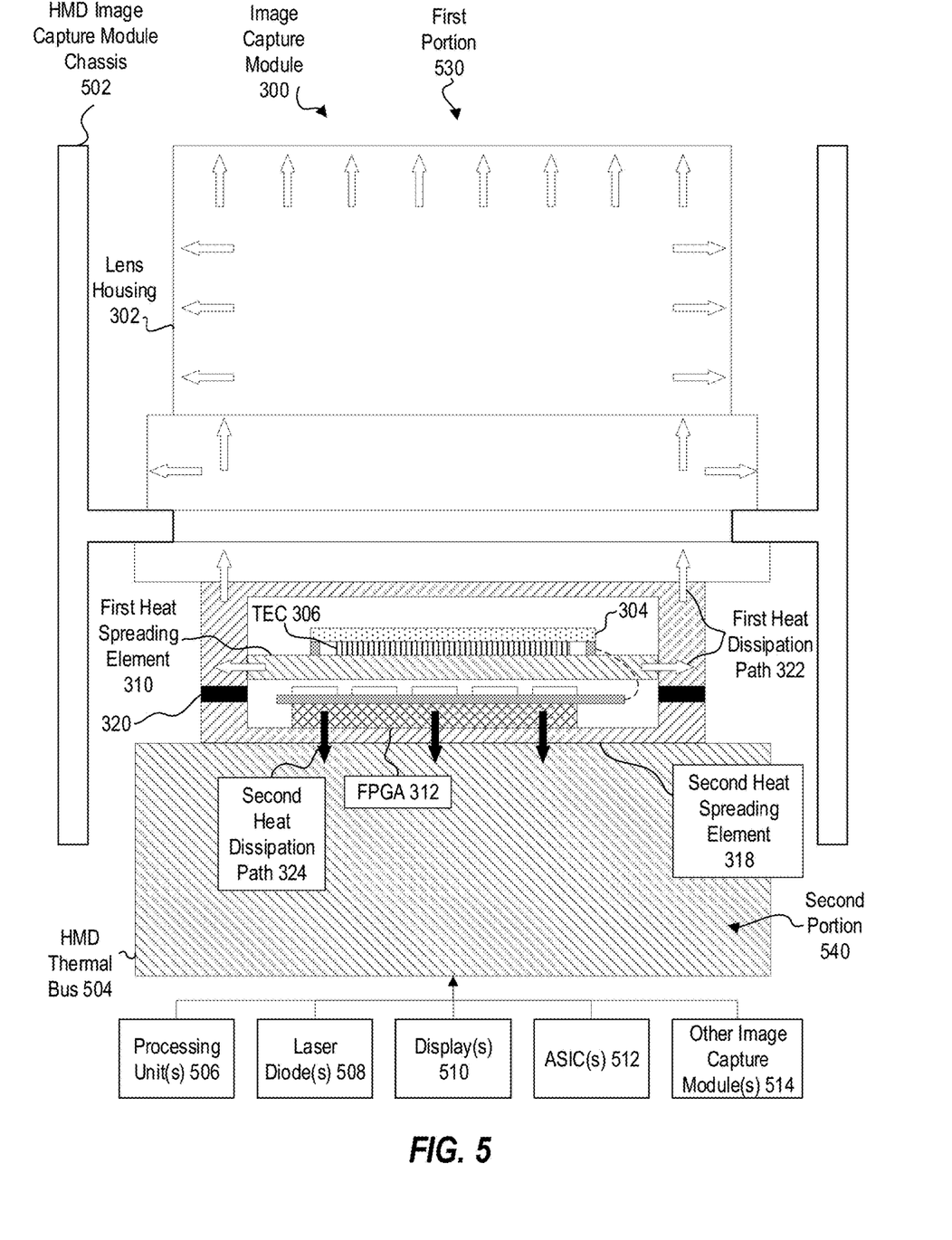
FIG. 5 illustrates example components of an HMD that includes an image capture module, in accordance with the present disclosure.

FIG. 5 illustrates example components of an HMD that includes an image capture module. In particular, FIG. 5 shows an HMD image capture module chassis 502 that is configured to receive an image capture module 300. Similar to the examples discussed with reference to FIGS. 3A-3C, the image capture module may include a SPAD sensor 304, a TEC 306, a first heat spreading element 310, a first heat dissipation path 322, an FPGA 312, a second heat spreading element 318, a second heat dissipation path 324, and a thermal isolation material 320 intervening between the first heat dissipation path 322 and the second heat dissipation path 324.

The first heat dissipation path 322 directs heat from the SPAD sensor 304 to a first portion 530 of an HMD of which the HMD image capture module chassis 502 is a part (e.g., HMD 200). The first portion 530 of the HMD may, in some implementations, coincide with a front portion of the image capture module 300, and the front portion of the image capture module 300 may at least partially form a front of the HMD (see FIG. 2, where the front portions of the SPAD sensors 202A and 202B are positioned at the front of the HMD). In this way, heat transferred from the SPAD sensor 304 may be directed to the first portion 530 of the HMD (or front of the HMD) to allow the heat from the SPAD sensor 304 to be dissipated into an environment surrounding the HMD (e.g., via wind that interfaces with the first portion 530 of the HMD during use).

The second heat dissipation path 324 directs heat from the FPGA 312 to a second portion 540 of the HMD of which the HMD image capture module chassis 502 is a part (e.g., HMD 200). The example shown in FIG. 5 shows the second portion 540 of the HMD as including an HMD thermal bus 504 of the HMD. The HMD thermal bus 504 is configured to direct the heat from the FPGA 312 (e.g., from the second heat spreading element 318) to another portion of the HMD, such as to the rear or top of the HMD for dissipation of the heat into an environment surrounding the HMD.

In some implementations, the HMD thermal bus 504 is configured to dissipate heat from one or more additional components of the HMD in combination with the FPGA 312 of the image capture module 300. For example, FIG. 5 illustrates arrows extending from other components of the HMD to the HMD thermal bus 504, conceptually representing that heat from other components of the HMD may be directed to the HMD thermal bus 504 for thermal management purposes. FIG. 5 illustrates the other components of the HMD as including processing unit(s) 506, laser diode(s) 508, display(s) 510, ASIC(s) 512, and other image capture module(s) 514. However, additional or alternative HMD components may transfer heat to the HMD thermal bus 504 in accordance with the present disclosure.

Accordingly, in some implementations, the FPGA 312 shares the HMD thermal bus 504 with other components of the HMD to combine the heat dissipation paths of the FPGA 312 and the other components of the HMD. Such implementations may allow cross-heating between the FPGA 312 and the other components of the HMD. However, because the FPGA 312 and/or other components of the HMD are not as susceptible to noise from dark count rate as the SPAD sensor 304, such cross-heating may have a minimal or no impact on user experiences.

In contrast, because the SPAD sensor 304 is susceptible to noise from dark count rate, the SPAD sensor 304 does not share the HMD thermal bus 504 with the FPGA 312 and the other components of the HMD. The SPAD sensor 304 instead utilizes a separate heat dissipation channel for directing heat from the SPAD sensor 304 to a different portion of the HMD. In this regard, SPAD sensor 304 and the heat dissipation path(s) thereof is/are thermally isolated from the FPGA 312 and the other components of the HMD. The SPAD sensor 304 is furthermore thermally isolated from the heat dissipation path(s) of the FPGA 312 and the other components of the HMD.

In this way, cross-heating from the FPGA 312 and the other components of the HMD to the SPAD sensor 304 may be mitigated or avoided, and dark count rate in the SPAD sensor 304 of the HMD may be reduced, thereby improving image quality of images captured by the SPAD sensor 304 (especially images captured under low light imaging conditions).

Example Method(s) for Thermal Mitigation of SPAD Arrays

The following discussion now refers to a number of methods and method acts that may be performed by the disclosed systems. Although the method acts are discussed in a certain order and illustrated in a flow chart as occurring in a particular order, no particular ordering is required unless specifically stated, or required because an act is dependent on another act being completed prior to the act being performed. One will appreciate that certain embodiments of the present disclosure may omit one or more of the acts described herein.

Figure 6:
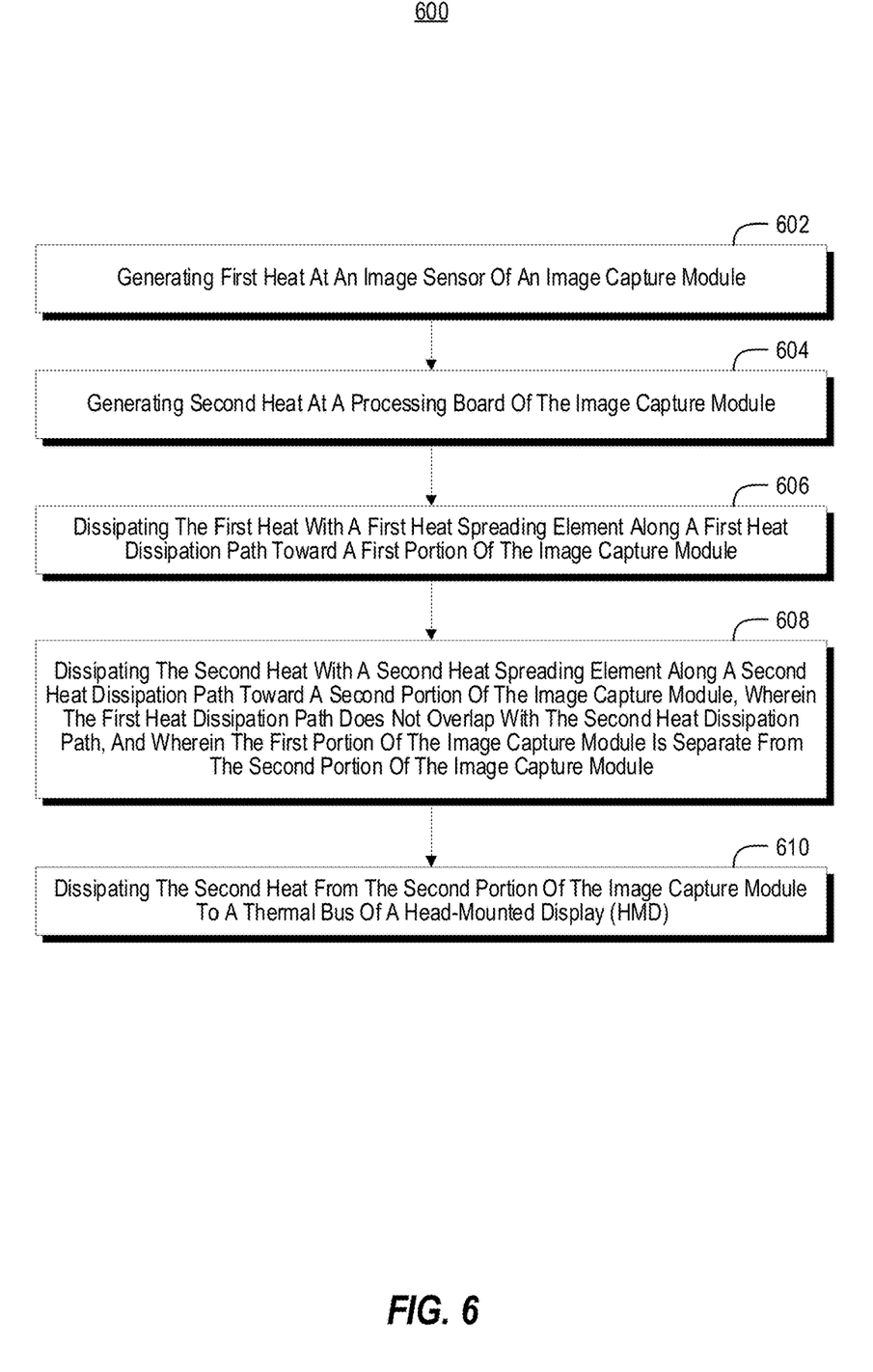
FIG. 6 illustrates an example flow diagram depicting acts associated with thermal mitigation of SPAD arrays.

FIG. 6 illustrates an example flow diagram 600 depicting acts associated with thermal mitigation of SPAD arrays. The discussion of the various acts represented in the flow diagrams include references to various hardware components described in more detail with reference to FIG. 1 through 5.

Act 602 of flow diagram 600 includes generating first heat at an image sensor of an image capture module. Act 602 of flow diagram 600 is performed, in some instances, utilizing a system 100, components thereof (e.g., processor(s) 102, storage 104, sensor(s) 110, I/O system(s) 114, communication system(s) 116), SPAD sensor(s) 202A, 202B, 304, and/or other components. In some instances, the image sensor is a silicon sensor, such as an array of SPAD pixels. Heat may be generated as a result of applying shutter operations to trigger avalanche events in response to detected photons.

Act 604 of flow diagram 600 includes generating second heat at a processing board of the image capture module. Act 604 of flow diagram 600 is performed, in some instances, utilizing a system 100, components thereof (e.g., processor(s) 102, storage 104, sensor(s) 110, I/O system(s) 114, communication system(s) 116), FPGA 312, and/or other components. In some implementations, the processing board is in data communication with the image sensor of act 602. In some instances, as noted above, the processing board comprises an FPGA.

Act 606 of flow diagram 600 includes dissipating the first heat with a first heat spreading element along a first heat dissipation path toward a first portion of the image capture module. Act 606 of flow diagram 600 is performed, in some instances, utilizing a system 100, components thereof (e.g., processor(s) 102, storage 104, sensor(s) 110, I/O system(s) 114, communication system(s) 116), first heat spreading element 310, first heat dissipation path 322, TEC 306, and/or other components. As indicated above, in some instances, a TEC that abuts the image sensor transfers the first heat from the image sensor to the first heat spreading element for dissipation along the first heat dissipation path. Furthermore, in some instances, the first portion of the image capture module to which the first heat is transferred is a front portion of the image capture module (or a front portion of an HMD).

Act 608 of flow diagram 600 includes dissipating the second heat with a second heat spreading element along a second heat dissipation path toward a second portion of the image capture module, wherein the first heat dissipation path does not overlap with the second heat dissipation path, and wherein the first portion of the image capture module is separate from the second portion of the image capture module. Act 608 is performed, in some instances, utilizing a system 100, components thereof (e.g., processor(s) 102, storage 104, sensor(s) 110, I/O system(s) 114, communication system(s) 116), second heat spreading element 318, second heat dissipation path 324, and/or other components. In some instances, the second portion of the image capture module is a back portion of the image capture module. Furthermore, in some implementations, a thermal isolation material separates the first heat dissipation path from the second heat dissipation path to facilitate thermal isolation between the image sensor and the processing board.

Act 610 of flow diagram 600 includes dissipating the second heat from the second portion of the image capture module to a thermal bus of a head-mounted display (HMD). Act 610 is performed, in some instances, utilizing a system 100, components thereof (e.g., processor(s) 102, storage 104, sensor(s) 110, I/O system(s) 114, communication system(s) 116), second heat spreading element 318, second heat dissipation path 324, HMD thermal bus 504, and/or other components. In some instances, the thermal bus of the HMD is configured to dissipate heat from one or more additional components of the HMD, which may include, by way of non-limiting example, a processing unit, a laser diode, a display, an application-specific integrated circuit (ASIC), and/or a separate image capture module.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are one or more "physical computer storage media" or "hardware storage device(s)." Computer-readable media that merely carry computer-executable instructions without storing the computer-executable instructions are "transmission media." Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in hardware in the form of computer-executable instructions, data, or data structures and that can be accessed by a general-purpose or special-purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Disclosed embodiments may comprise or utilize cloud computing. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, wearable devices, and the like. The invention may also be practiced in distributed system environments where multiple computer systems (e.g., local and remote systems), which are linked through a network (either by hardwired data links, wireless data links, or by a combination of hardwired and wireless data links), perform tasks. In a distributed system environment, program modules may be located in local and/or remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), central processing units (CPUs), graphics processing units (GPUs), and/or others.

As used herein, the terms "executable module," "executable component," "component," "module," or "engine" can refer to hardware processing units or to software objects, routines, or methods that may be executed on one or more computer systems. The different components, modules, engines, and services described herein may be implemented as objects or processors that execute on one or more computer systems (e.g. as separate threads).

One will also appreciate how any feature or operation disclosed herein may be combined with any one or combination of the other features and operations disclosed herein. Additionally, the content or feature in any one of the figures may be combined or used in connection with any content or feature used in any of the other figures. In this regard, the content disclosed in any one figure is not mutually exclusive and instead may be combinable with the content from any of the other figures.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. An image capture module configured for improved heat dissipation, comprising: a lens housing;

an image sensor;
a first heat spreading element positioned to direct heat from the image sensor along a first heat dissipation path toward a first portion of the image capture module, the first portion of the image capture module comprising at least part of the lens housing;
a processing board in data communication with the image sensor; and
a second heat spreading element positioned to dissipate heat from the processing board along a second heat dissipation path toward a second portion of the image capture module, wherein the first heat dissipation path does not overlap the second heat dissipation path, and wherein the first portion of the image capture module is separate from the second portion of the image capture module, and wherein a thermal isolation material is positioned to thermally isolate the first heat dissipation path from the second heat dissipation path.

2. The image capture module of claim 1, wherein the first portion of the image capture module comprises a front portion of the image capture module, and wherein the second portion of the image capture module comprises a back portion of the image capture module.

3. The image capture module of claim 1, wherein the image sensor and the processing board are thermally isolated from one another within the image capture module.

4. The image capture module of claim 3, wherein the image sensor comprises an array of single photon avalanche diode (SPAD) sensor pixels.

5. The image capture module of claim 1, further comprising a thermoelectric cooler (TEC) configured to transfer heat from the image sensor to the first heat spreading element.

6. The image capture module of claim 5, wherein the TEC abuts an active region of the image sensor.

7. The image capture module of claim 1, wherein the processing board comprises a field programmable gate array (FPGA).

8. A head-mounted display (HMD), comprising:
an image capture module mounted on the HMD and configured for improved heat dissipation, the image capture module comprising: a lens housing;
an image sensor;
a first heat spreading element positioned to direct heat from the image sensor along a first heat dissipation path toward a first portion of the HMD, the first portion of the HMD comprising at least part of the lens housing;
a processing board in data communication with the image sensor; and
a second heat spreading element positioned to dissipate heat from the processing board along a second heat dissipation path toward a second portion of the HMD, wherein the first heat dissipation path does not overlap the second heat dissipation path, and wherein the first portion of the HMD is separate from the second portion of the HMD, and wherein a thermal isolation material is positioned to thermally isolate the first heating dissipation path from the second heat dissipation path.

9. The HMD of claim 8, wherein the image sensor and the processing board are thermally isolated from one another within the image capture module.

10. The HMD of claim 8, wherein the image sensor comprises an array of single photon avalanche diode (SPAD) sensor pixels.

11. The HMD of claim 8, wherein the image capture module further comprises a thermoelectric cooler (TEC) configured to transfer heat from the image sensor to the first heat spreading element.

12. The HMD of claim 11, wherein the TEC abuts an active region of the image sensor.

13. The HMD of claim 8, wherein the processing board comprises a field programmable gate array (FPGA).

14. The HMD of claim 8, wherein the first portion of the HMD comprises a front portion of the image capture module, and wherein the second portion of the HMD comprises a thermal bus configured to dissipate heat from one or more additional components of the HMD.

15. The HMD of claim 14, wherein the one or more other additional components of the HMD includes a processing unit, a laser diode, a display, an application-specific integrated circuit (ASIC), or a separate image capture module.

16. A method for dissipating heat from an image capture module, comprising:
generating first heat at an image sensor of an image capture module;
generating second heat at a processing board of the image capture module, the processing board being in data communication with the image sensor;
dissipating the first heat with a first heat spreading element along a first heat dissipation path toward a first portion of the image capture module, the first portion of the image capture module comprising at least part of a lens housing; and
dissipating the second heat with a second heat spreading element along a second heat dissipation path toward a second portion of the image capture module, wherein the first heat dissipation path does not overlap with the second heat dissipation path, wherein the first portion of the image capture module is separate from the second portion of the image capture module, and wherein a thermal isolation material is positioned to thermally isolate the first heating dissipation path from the second heat dissipation path.

17. The method of claim 16, further comprising dissipating the second heat from the second portion of the image capture module to a thermal bus of a head-mounted display (HMD).

* * * * *